United States Patent
Park et al.

(10) Patent No.: US 7,005,677 B2
(45) Date of Patent: *Feb. 28, 2006

(54) DUAL PANEL TYPE ORGANIC ELECTROLUMINESCENT DISPLAY DEVICE AND MANUFACTURING METHOD FOR THE SAME

(75) Inventors: Jae-Yong Park, Gyeonggi-do (KR); So-Haeng Cho, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/743,010

(22) Filed: Dec. 23, 2003

(65) Prior Publication Data

US 2004/0145306 A1 Jul. 29, 2004

(30) Foreign Application Priority Data

Dec. 26, 2002 (KR) ................. 10-2002-0084577

(51) Int. Cl.
*H01L 29/04* (2006.01)
*H01L 31/036* (2006.01)

(52) U.S. Cl. ..................... 257/72; 257/59; 257/40
(58) Field of Classification Search .............. 257/72, 257/59, 40
See application file for complete search history.

(56) References Cited

U.S. PATENT DOCUMENTS

| | | | |
|---|---|---|---|
| 5,276,380 A | 1/1994 | Tang | 313/504 |
| 5,294,869 A | 3/1994 | Tang et al. | 313/504 |
| 5,294,870 A | 3/1994 | Tang et al. | 313/504 |
| 5,701,055 A | 12/1997 | Nagayama et al. | 313/504 |
| 5,742,129 A | 4/1998 | Nagayama et al. | 315/167 |
| 5,952,037 A | 9/1999 | Nagayama et al. | 427/66 |
| 6,046,547 A | 4/2000 | Nishio et al. | 315/169.3 |
| 6,175,345 B1 | 1/2001 | Kuribayashi et al. | 345/76 |
| 6,373,455 B1 | 4/2002 | Kuribayashi et al. | 345/76 |
| 6,548,961 B1 | 4/2003 | Barth et al. | 315/169.3 |
| 6,828,587 B1 * | 12/2004 | Yamazaki et al. | 257/72 |
| 2002/0024096 A1 | 2/2002 | Yamazaki et al. | 257/359 |
| 2002/0050795 A1 | 5/2002 | Imura | 315/169.3 |
| 2002/0158577 A1 | 10/2002 | Shimoda et al. | 313/506 |
| 2003/0201445 A1 | 10/2003 | Park et al. | 257/79 |
| 2003/0205763 A1 | 11/2003 | Park et al. | 257/359 |
| 2004/0135520 A1 * | 7/2004 | Park et al. | 315/169.3 |

FOREIGN PATENT DOCUMENTS

| | | |
|---|---|---|
| EP | 1 193 676 | 4/2002 |
| EP | 1 220 187 | 7/2002 |

(Continued)

*Primary Examiner*—Tu-Tu Ho
(74) *Attorney, Agent, or Firm*—Morgan Lewis & Bockius LLP

(57) ABSTRACT

An organic electroluminescent display (ELD) device having a first substrate having an array element layer and a second substrate having an organic electroluminescent diode includes a gate line formed on the first substrate, a data line formed on the first substrate, a power supply line spaced apart from the data line and formed on the first substrate, the power supply line being formed with same material as the gate line in a same process as the gate line, a switching thin film transistor having a semiconductor layer formed of amorphous silicon, a driving thin film transistor formed near a crossing portion of the switching thin film transistor and the power supply line, a connecting electrode connected to the driving thin film transistor and an electrical connecting pattern for electrically connecting the connecting electrode to the organic electroluminescent diode.

7 Claims, 23 Drawing Sheets

FOREIGN PATENT DOCUMENTS

| | | |
|---|---|---|
| JP | 04-280231 | 10/1992 |
| JP | 2001-117509 | 4/2001 |
| JP | 2002-26129 | 1/2002 |
| KR | 2002-0047889 | 6/2002 |
| KR | 2004-0079476 | 9/2004 |
| WO | WO-02/078101 | 10/2005 |

* cited by examiner

US 7,005,677 B2

DUAL PANEL TYPE ORGANIC ELECTROLUMINESCENT DISPLAY DEVICE AND MANUFACTURING METHOD FOR THE SAME

This application claims the benefit of Korean Patent Application No. 2002-84577, filed on Dec. 26, 2002 in Korea, which is hereby incorporated by reference.

BACKGROUND OF THE INVENTION

1. Field of the Invention

The present invention relates to a flat panel display device and more particularly, to an organic electroluminescent display (ELD) device and manufacturing method for the same.

2. Discussion of the Related Art

Liquid crystal display (LCD) devices have been most widely used in the field of flat panel display devices because of their light weight and low power consumption. However, the liquid crystal display (LCD) device is not a light emitting element but rather a light receiving element that needs an additional light source to display images. Thus, a technical limit exists with regard to improving brightness, contrast ratio, viewing angle as well as enlarging a size of a liquid crystal display panel. For this reason, much research has been actively pursued in the field to develop a new flat panel display element that can overcome the aforementioned problems.

The organic electroluminescent display (ELD) device is one of the new flat panel display elements resulting from the research. Because the organic electroluminescent display (ELD) device emits light, the viewing angle and the contrast ratio is superior compared to the liquid crystal display (LCD) device. In addition, because the organic electroluminescent display (ELD) does not need a backlight as a light source, it has advantages, such as being light weight, having a small dimension, and having low power consumption. Moreover, the organic electroluminescent display (ELD) device can be driven with a low DC (direct current) and has a fast response time. Because the organic electroluminescent display (ELD) device uses a solid material instead of fluid material, such as liquid crystal, it is more stable under an external impact. Further, the organic electroluminescent display (ELD) has a wider range of temperature under which it can operate as compared to the liquid crystal display (LCD) device. The organic electroluminescent display (ELD) device also has an advantage in terms of production cost. More specifically, a deposition apparatus and an encapsulation apparatus are all that is needed for manufacturing the organic electroluminescent display (ELD) device while the liquid crystal display (LCD) device or Plasma display panels (PDPs) need many kinds of apparatus. The manufacturing process for the organic electroluminescent display (ELD) device is very simple compared to the liquid crystal display (LCD) device or the Plasma display panels (PDPs).

Organic electroluminescent display (ELD) devices may be classified into a passive matrix-type and an active matrix-type. In the case of the active matrix-type organic electroluminescent display (ELD) device, a voltage applied to the pixel is stored in a storage capacitor $C_{St}$ and maintained until a signal for the next frame is applied. Accordingly, the pixel can retain the signal until the next frame regardless of the number of the scan lines. Because the active matrix-type organic electroluminescent display (ELD) device can obtain a desired luminance with low direct current (DC), the active matrix-type organic electroluminescent display (ELD) device has advantages, such as low power consumption and high resolution while having a large size.

A basic structure and an operational property of the active matrix-type organic electroluminescent display (ELD) device will be described hereinafter with reference to FIG. 1. FIG. 1 is a circuit diagram of a pixel of a related art active matrix organic electroluminescent display (ELD) device. In FIG. 1, a scan line 2 is formed in a first direction and signal and power supply lines 4 and 6 spaced apart from the scan line 2 are formed in a second direction. The scan line 2 and the signal and power supply lines 4 and 6 define a pixel region between them adjacent to where they cross each other. A switching thin film transistor $T_S$, such as an addressing element, is formed near an intersection of the scan and signal lines 2 and 4, and a storage capacitor $C_{ST}$ is connected to the switching thin film transistor $T_S$. A driving thin film transistor $T_D$, such as a current source element, is connected to the switching thin film transistor $T_S$, the storage capacitor $C_{ST}$ and the power supply line 6. The driving thin film transistor $T_D$ is electrically connected to an anode electrode and an organic electroluminescent diode E that is driven by a static current and is electrically connected between the anode electrode and a cathode electrode. The anode and cathode electrodes are components of the organic electroluminescent diode E. The switching thin film transistor $T_S$ serves to control a voltage and the storage capacitor $C_{ST}$ serves to store charge. The driving operation of the related art organic electroluminescent display (ELD) device will be described hereinafter.

Once a gate of the switching thin film transistor $T_S$ is on, a data signal can be applied to the driving thin film transistor $T_D$ and the storage capacitor $C_{ST}$ via the gate of the switching thin film transistor $T_S$. If a gate of the driving thin film transistor $T_D$ is on, a current from the power supply line 6 can be applied to the organic electroluminescent diode E passing through the gate of the driving thin film transistor $T_D$ and thus the organic electroluminescent diode emits light. Because the degree of how much the gate of the driving thin film transistor $T_D$ is open depends on amplitude of the data signal, different gray levels can be displayed by controlling an amount of current that passes through the driving thin film transistor $T_D$. A data signal, which also is stored in the storage capacitor $C_{ST}$, is continuously applied to the driving thin film transistor $T_D$, and thus the organic electroluminescent diode E can continuously emit light until a signal for a next frame is applied.

FIG. 2 is a plan view of a pixel of a related art active matrix organic electroluminescent display (ELD) device. In FIG. 2, a switching thin film transistor $T_S$ and a driving thin film transistor $T_D$ are formed, for example. In FIG. 2, a gate line 37 is formed in a first direction and signal and power supply lines 51 and 41 spaced apart from the gate line 37 are formed in a second direction. The gate line 37 defines a pixel region E by crossing the data line 51 and the power supply line 41. A switching thin film transistor $T_S$ is formed near an intersection of the gate and the data lines 37 and 51. A driving thin film transistor $T_D$ is formed near an intersection of the switching thin film transistor $T_S$ and the power supply line 41. The power supply line 41 and a capacitor electrode 34 connected to a semiconductor layer 31 of the switching thin film transistor $T_S$ to form a storage capacitor $C_{ST}$. A first electrode 58 is electrically connected to the driving thin film transistor $T_D$. Although not shown in FIG. 2, an organic light emitting layer and a second electrode sequentially formed over the first electrode 58. An area over which the first electrode 58 is formed is defined as an organic light-emitting region I. The driving thin film transistor $T_D$ has a semiconductor layer 32 and a gate electrode 38. The switching thin film transistor $T_S$ has a gate electrode 35. Laminated structures of the organic light-emitting region I, the driving thin film transistor $T_D$ and the storage capacitor $C_{ST}$ will-be described hereinafter with reference to FIG. 3.

FIG. 3 is a cross-sectional view taken along a line III–III' in FIG. 2. As shown in FIG. 3, a driving thin film transistor $T_D$ having a semiconductor layer 32, a gate electrode 38, and source and drain electrodes 50 and 52 are formed on an insulating substrate 1. A power electrode 42 extending from a power supply line (not shown) is electrically connected to the source electrode 50. A first electrode formed of transparent conductive material is electrically connected to the drain electrode 52. A capacitor electrode 34 is formed under the power electrode 42 and is of the same material as the semiconductor layer 32. The power electrode 42 and the capacitor electrode 34 form a storage capacitor $C_{ST}$. An organic light-emitting layer 64 and a cathode electrode 66 are sequentially formed on the first electrode 58 and thus form an organic light-emitting region I. First, second, third and fourth passivation layers 40, 44, 54 and 60 each respectively having a contact hole for electrical contacts in each layer are formed on the substrate 1. A buffer layer 30 is formed between the substrate 1 and the semiconductor layer 32. The first passivation layer 40 is formed between the storage electrode 34 and the power electrode 42 and serves as an insulating material. The second passivation layer 44 is formed on the power electrode 42 and the third passivation layer 54 is formed between the source electrode 50 and the first electrode 58. The fourth passivation layer 60 is formed between the driving thin film transistor $T_D$ and a second electrode 66.

FIGS. 4A to 4I are cross-sectional views illustrating a fabrication sequence of the related art active matrix organic electroluminescent display (ELD) device shown in FIG. 2. The laminated structures of the organic electroluminescent display (ELD) device may be formed by a photolithographic process in which the laminated structures are patterned by exposing and then developing a photoresist, such as a photo sensitive material. In FIG. 4A, a buffer layer 30 is formed on an insulating substrate 1 with a first insulating material. Then polycrystalline silicon active layer 32a and a polycrystalline silicon capacitor electrode 34 are formed on the buffer layer 30 with a first mask.

As shown in FIG. 4B, a gate insulating layer 36 and a gate electrode 38 are formed on the active layer 32a by sequentially depositing a second insulating material and a first metal material on the active layer 32a and then patterning the deposited material with a second mask. As shown in FIG. 4C, a first passivation layer 40 is formed over the whole substrate on which the gate insulating layer 36 and the gate electrode 38 are already formed. A power electrode 42 is subsequently formed on the first passivation layer 40 in space corresponding to the capacitor electrode 34 by depositing a second metal material on the first passivation layer 40 and then patterning it with a third mask.

As shown in FIG. 4D, a second passivation layer 44 having first and second ohmic contact layers 46a and 46b and a capacitor contact hole 48 is formed on the first passivation layer 40 by depositing a third insulating material on the first passivation layer 40 and then patterning it with a fourth mask. The first and second ohmic contact holes 46a and 46b expose portions at both sides of the active layer 32a and the capacitor contact hole 48 exposes a portion of the power electrode 42. A first portion of the active layer 32a is a drain region IIb and a second portion of the active layer 32a is a source region IIa. The source and drain regions IIa and IIb are for contacting the source and drain electrodes, respectively, that will be subsequently formed. The exposed first and second portions on both sides of the active layer 32a are doped by ions to form an ohmic contact layers 32b. The active layer 32a and the ohmic contact layers 32b form a semiconductor layer 32.

As shown in FIG. 4E, source and drain electrodes 50 and 52 are subsequently formed by depositing a third metal material on the substrate 1 on which the ohmic contact layers 32b are already formed and then patterning it with a fifth mask. The source electrode 50 is connected to the ohmic contact layer 32b in the source region IIa and the power electrode 42 respectively via the first ohmic contact hole 46a shown in FIG. 4D and the capacitor contact hole 48 in FIG. 4D. The drain electrode 52 is connected to the ohmic contact layer 32b in the drain region IIb via the second ohmic contact hole 46b in FIG. 4D. The semiconductor layer 32, the gate electrode 38 and the source and drain electrodes 50 and 52 form a driving thin film transistor $T_D$. The power electrode 42 and the capacitor electrode 34 are electrically connected to the source electrode 52 and a semiconductor layer (not shown) of a switching thin film transistor (not shown), respectively, and form a storage capacitor CST using the first passivation layer 40 as an insulating body.

As shown in FIG. 4F, a third passivation layer 54 having a drain contact hole 56 is formed by depositing a fourth insulating material on the whole substrate 1 on which the source and drain electrodes 50 and 52 are already formed and then patterning it with a sixth mask. In FIG. 4G, a first electrode 58 connected to the drain electrode 52 via the drain contact hole 56 is formed on the third passivation layer 54 in space corresponding to an organic light-emitting region I by depositing a fourth metal material on the third passivation layer 54 and then patterning it with a seventh mask. As shown in FIG. 4H, a fourth passivation layer 60 having a first electrode exposure portion 62 exposing a first electrode portion corresponding to the organic light-emitting region I is formed by depositing a fifth insulating material on the whole substrate 1 over which the first electrode 58 is already formed and then patterning it with a eight mask. The fourth passivation layer 60 also serves to protect the driving thin film transistor TD from moisture and contaminants. The photolithographic mask process is completed as aforementioned.

As shown in FIG. 4I, an organic light-emitting layer 64 contacting the first electrode. 58 via the first electrode exposure portion 62 shown in FIG. 4H is formed on the substrate 1 on which the fourth passivation layer 60 is already formed. A second electrode 66 is subsequently formed on the organic light-emitting layer 64 and the fourth passivation layer 60 by depositing a fifth metal material on the whole substrate 1. If the first electrode 58 is used as an anode electrode, the fifth metal material must have a reflection property to reflect the light emitted from the organic light-emitting layer 64 to display an image. In addition, the fifth metal material is selected from the metal materials having a low work function so that the second electrode 66 can easily give away electrons.

FIG. 5 is a cross-sectional view of a related art organic electroluminescent display (ELD) device. In FIG. 5, a first substrate 70 on which a plurality of sub-pixels are defined and a second substrate 90 are spaced apart from each other. An array element layer 80 having a plurality of driving thin film transistors $T_D$ corresponding to each sub-pixel is formed on the first substrate 70. A plurality of first electrodes 72 corresponding to each sub-pixel is formed on the array element layer 80 and connected to the corresponding-driving thin film transistor $T_D$ of each sub-pixel. An organic light-emitting layer 74 for displaying red (R), green (G) and blue (B) colors in each sub-pixel is formed on the first electrode 72. A second electrode 76 is formed on the organic light-emitting layer 74. The first and second electrodes 72 and 76 and the organic light-emitting layer 74 form an organic electroluminescent diode E. Light emitted from the organic light-emitting layer 74 passes through the first electrode 72. That is, the organic electroluminescent display (ELD) device shown in FIG. 5 is a bottom emission-type organic electroluminescent display (ELD) device. The second substrate 90 is used as an encapsulating substrate and has a depressed portion 92 at a middle surface thereof and a moisture absorbent desiccant 94 for protecting the organic electroluminescent diode E from exterior moisture. The second substrate 94 is spaced a certain distance apart from the second electrode 76. A seal pattern 85 is formed on one of the first and second substrates 70 and 90 to attach the first and second substrates 70 and 90.

The related art bottom emission-type organic electroluminescent display (ELD) device is completed by attaching the substrate on which the array element layer and the organic electroluminescent diode are formed to an additional encapsulating substrate. If the array element layer and the organic electroluminescent diode are formed on the same substrate, then a yield of a panel having the array element layer and the organic electroluminescent diode is dependent upon the product of the individual yields of the array element layer and the organic electroluminescent diode. However, the yield of the panel is greatly affected by the yield of the organic electroluminescent diode. Accordingly, if an organic electroluminescent diode that is formed of a thin film usually having a thickness of 1000 Å has a defect due to impurities and contaminants, the panel is classified as an defective panel. This leads to wasted production costs and material, thereby decreasing the yield of the panel.

The bottom emission-type organic electroluminescent display (ELD) devices are advantageous because of their high image stability and easily configurable fabrication processing. However, the bottom emission-type organic electroluminescent display (ELD) devices are not adequate for implementation in devices that require high resolution due to aperture ratio limitations. In addition, since top emission-type organic electroluminescent display (ELD) devices emit light upward from the substrate, the light can be emitted without influencing the thin film transistor that is positioned under the light-emitting layer. Thus, design of the thin film transistor may be simplified. In addition, the aperture ratio is greater in top emission-type organic electroluminescent display (ELD) devices. However, since a cathode is commonly formed over the organic light-emitting layer in the top emission-type organic electroluminescent display (ELD) devices, material-selection and light transmittance are limited such that light transmission efficiency is lowered. If a thin film-type passivation layer is formed to prevent a reduction of the light transmittance, the thin film passivation layer may fail to prevent infiltration of exterior air into the device.

SUMMARY OF THE INVENTION

Accordingly, the present invention is directed to an organic electroluminescent display (ELD) device and manufacturing method for the same that substantially obviates one or more of problems due to limitations and disadvantages of the related art.

An object of the present invention is to provide an organic electroluminescent display (ELD) device with increased yield.

Another advantage of the present invention is to provide a manufacturing method for an organic electroluminescent display (ELD) device that has reduced masking steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device having a first substrate having an array element layer and a second substrate having an organic electroluminescent diode comprises a gate line formed on the first substrate in a first direction, a data line formed on the first substrate in a second direction perpendicular to the first direction, a power supply line spaced apart from the data line and formed on the first substrate in the second direction, the power supply line being formed with same material as the gate line in a same process as the gate line, the power supply line having an additional power supply link line near a crossing portion of the gate line and the power supply line, a switching thin film transistor formed near a crossing portion of the gate and data lines, the switching thin film transistor having a semiconductor layer formed of amorphous silicon, a driving thin film transistor formed near a crossing portion of the switching thin film transistor and the power supply line, the driving thin film transistor having a semiconductor layer formed of same material as the semiconductor layer of the switching thin film transistor, a connecting electrode connected to the driving thin film transistor, and an electrical connecting pattern formed between the first substrate and the second substrate for electrically connecting the connecting electrode to the organic electroluminescent diode.

A method for manufacturing an organic electroluminescent display (ELD), wherein an array element layer and an organic electroluminescent diode are formed on different substrates and connected to each other by an electrical connecting pattern, comprises forming a gate electrode, a gate pad and a power supply pad by depositing a first metal material on a substrate and then patterning the deposited first metal material by a first mask process, forming a gate insulating layer by depositing a first insulating material on the substrate on which the gate electrode, the gate pad and the power supply pad are already formed, forming a semiconductor layer on the gate insulating layer in space corresponding to the gate electrode by sequentially depositing amorphous silicon and impurity-doped amorphous silicon and then patterning the deposited amorphous silicon and the impurity-doped amorphous silicon by a second mask process, forming a first gate pad contact hole exposing a portion of the gate pad and a first power supply pad contact hole exposing a portion of the power supply pad by patterning portions of the gate insulating layer corresponding to the gate pad and the power supply pad by a third mask process, forming a source electrode, a drain electrode, a data pad, a first gate pad electrode and a first power supply pad electrode by depositing a second metal material on the substrate on which the semiconductor layer, the first gate pad contact hole and the first power supply pad contact hole are already formed and then patterning the deposited second metal material by a fourth mask process, wherein the source and drain electrodes are formed on the semiconductor layer and spaced apart from each other, the source and drain electrodes form a thin film transistor together with the gate electrode and the semiconductor layer, the first gate pad electrode is connected to the gate pad via the first gate pad contact hole and the first power supply pad electrode is connected to the power supply pad via the first power supply pad contact hole; forming a channel between the source and drain electrodes by removing the impurity-doped amorphous silicon between the source and drain electrodes, forming a passivation layer having a source contact hole, a drain contact hole, a data pad contact hole, a second gate pad contact hole and a second power supply pad contact hole by depositing a second insulating material on the substrate on which the thin film transistor, the data pad, the first gate pad electrode and the first power supply pad electrode are already formed and then patterning the deposited second insulating material by a fifth mask process, wherein the source and drain contact holes respectively expose portions of the source electrode and the drain electrode, the data pad contact hole exposes a portion of the data pad and the second gate pad and power supply pad contact holes respectively expose portions of the first gate pad electrode and the first power supply pad electrode, forming an electrical connecting pattern on the passivation layer corresponding to an electrical connecting region by depositing a third insulating material on the passivation layer and then patterning the deposited third insulating material by a sixth mask process, wherein the connecting electrode is connected to the organic electroluminescent diode at the electrical connecting region, and forming a connecting electrode, a power electrode, a data pad electrode, a second gate pad electrode and a second power supply pad electrode by depositing a third metal material on the substrate on which the electrical connecting pattern is already formed and then patterning the deposited third metal material by a seventh mask process, wherein the connecting electrode covers the electrical connecting pattern and is connected to the drain electrode via the drain contact hole, the power electrode is connected to the source electrode via the source contact hole, the data pad electrode is connected to the data pad via the data pad contact hole, the second gate pad electrode is connected to the first gate pad electrode via the second gate pad contact hole and the second power supply pad electrode is connected to the first power supply pad electrode via the second power supply pad contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the illustrated embodiment of the present invention, which is illustrated in the accompanying drawings.

A dual panel type organic electroluminescent display (ELD) device according to the present invention that will be described hereinafter is an active matrix type and a top emission type organic electroluminescent display (ELD) device.

Figure 1:
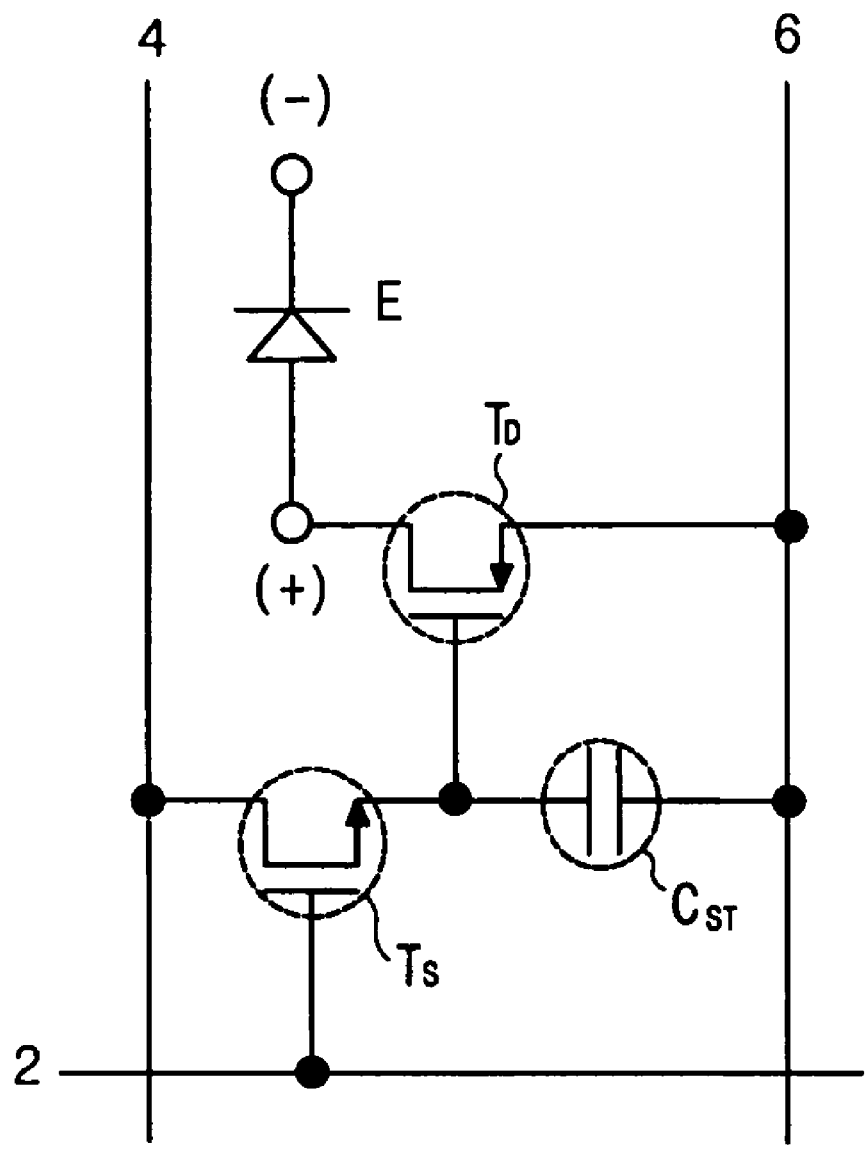
FIG. 1 is a circuit diagram of a pixel of a related art active matrix organic electroluminescent display (ELD) device.
Figure 2:
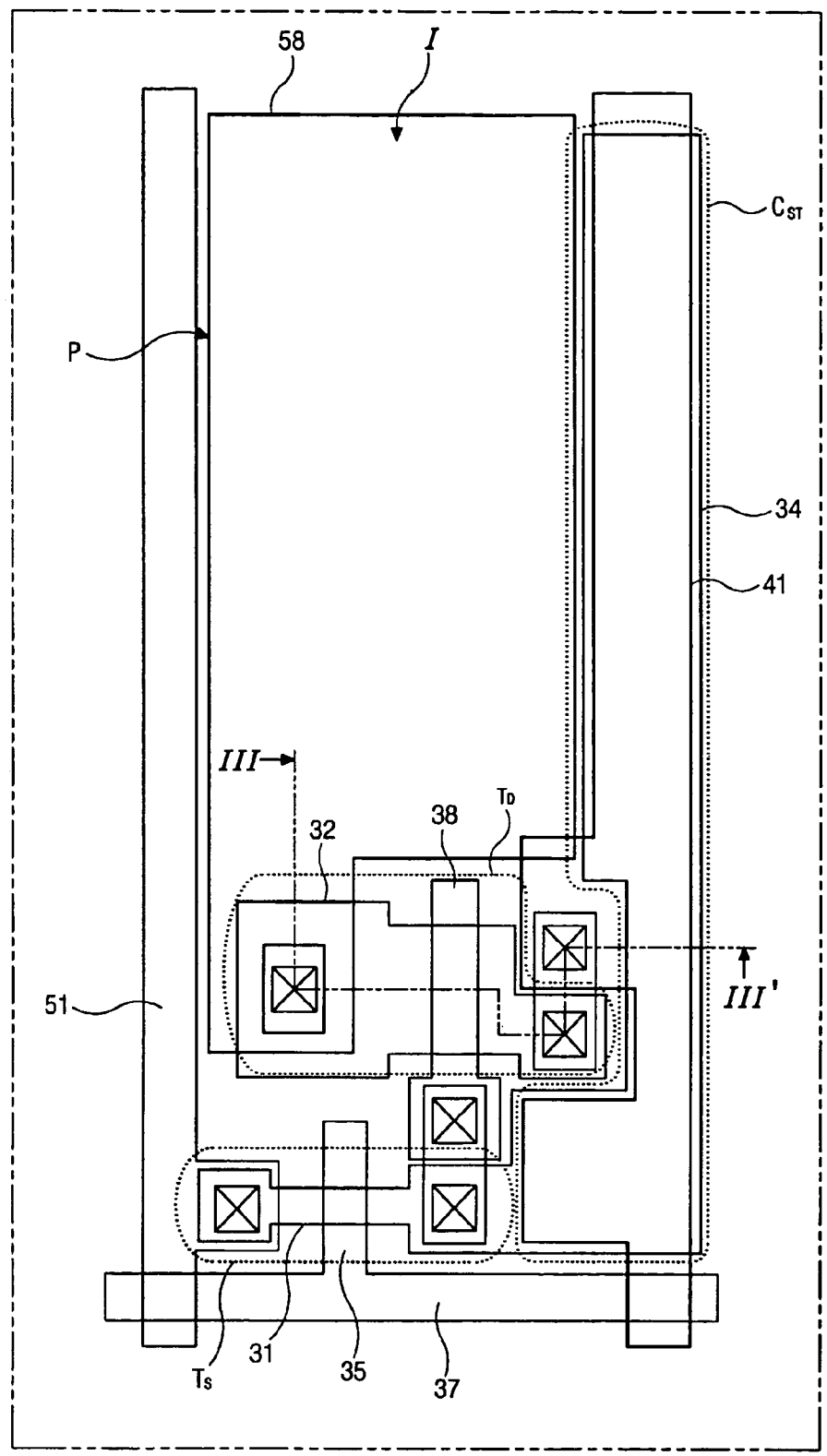
FIG. 2 is a plan view of a pixel of a related art active matrix organic electroluminescent display (ELD) device.
Figure 3:
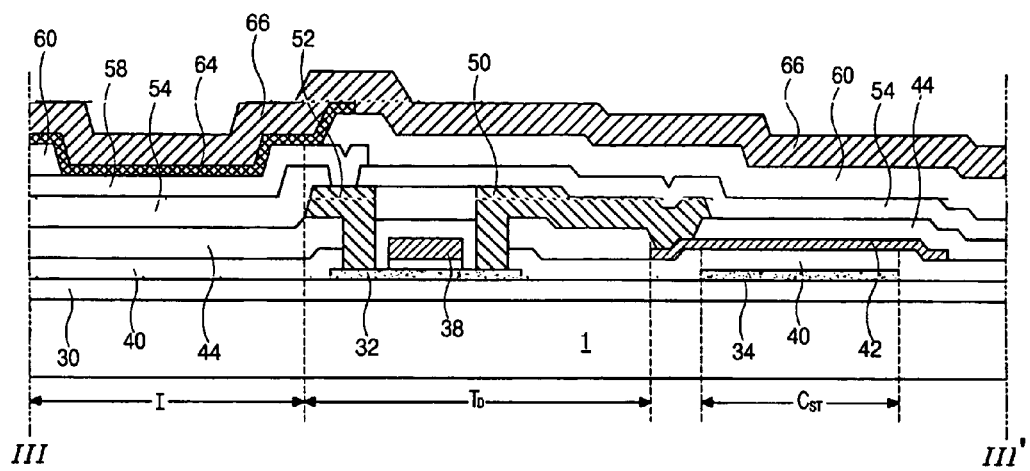
FIG. 3 is a cross-sectional view taken along a line III–III' in FIG. 2.
Figure 4A:
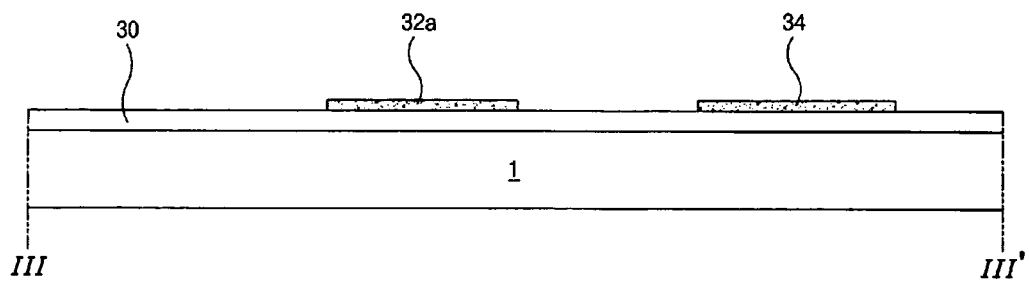
FIGS. 4A to 4I are cross-sectional views illustrating fabrication sequence of the related art active matrix organic electroluminescent display (ELD) device in FIG. 2.
Figure 4B:
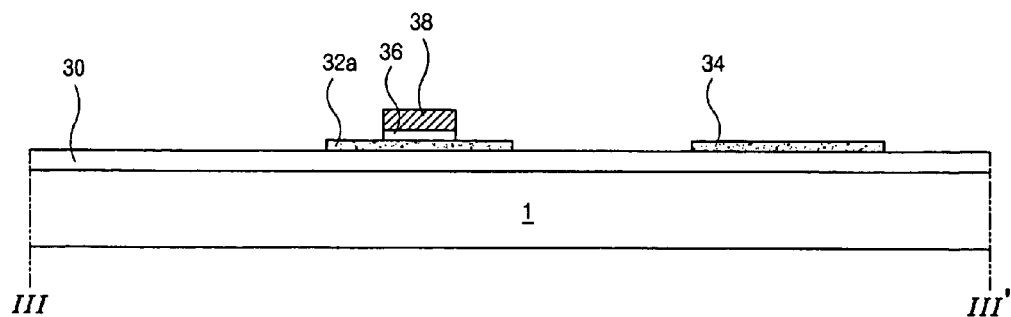
Figure 4C:
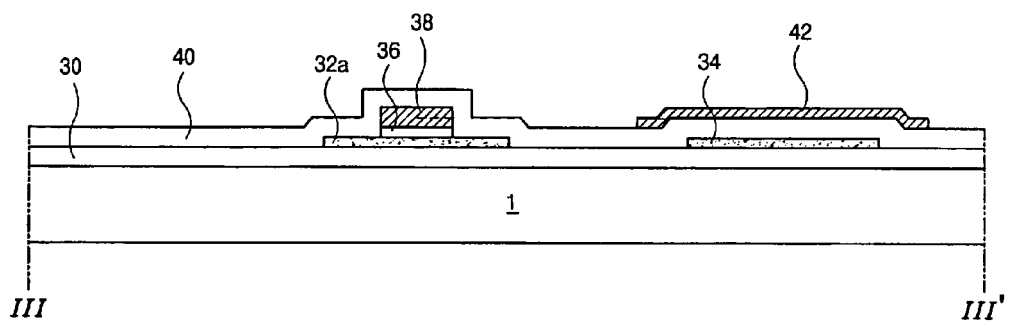
Figure 4D:
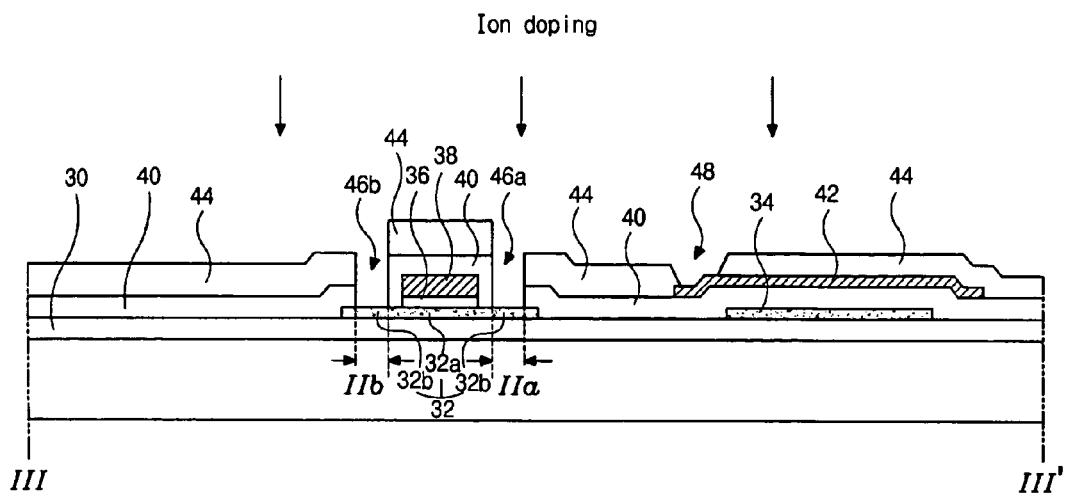
Figure 4E:
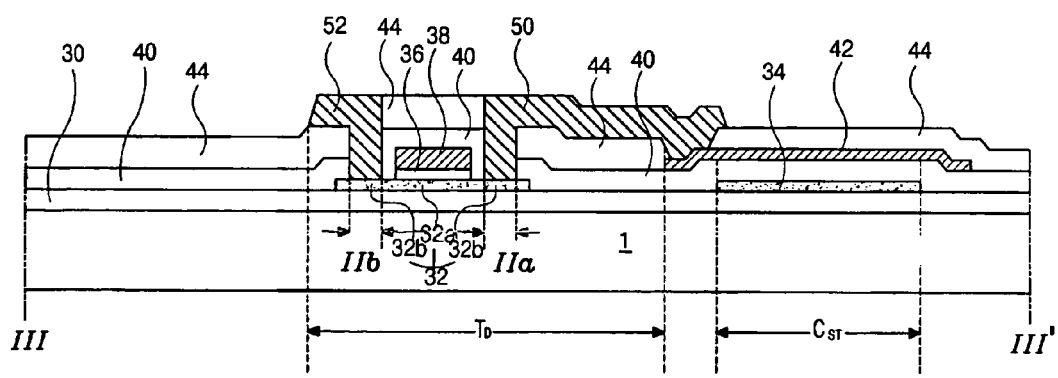
Figure 4F:
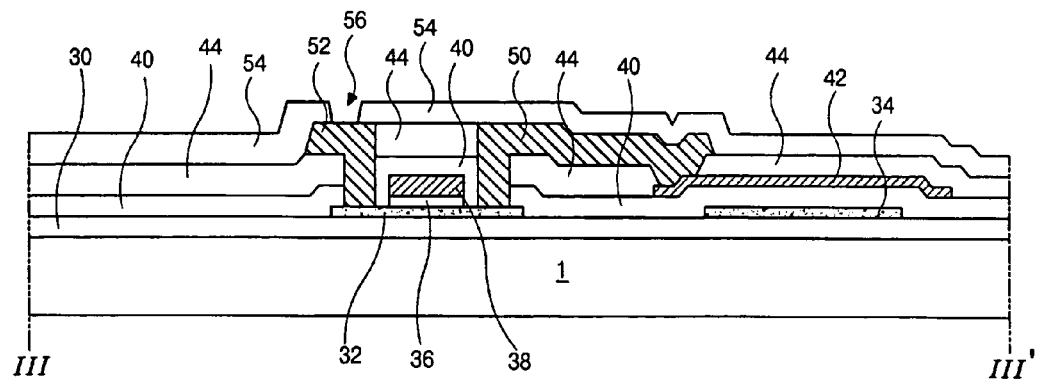
Figure 4G:
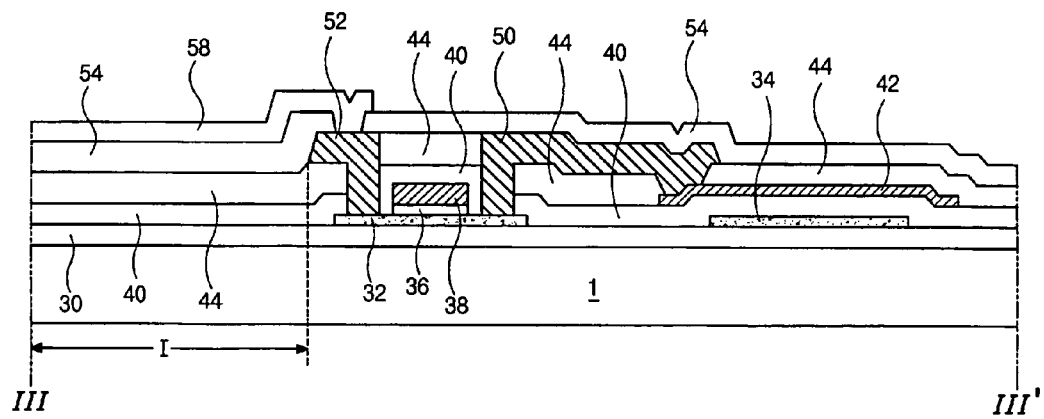
Figure 4H:
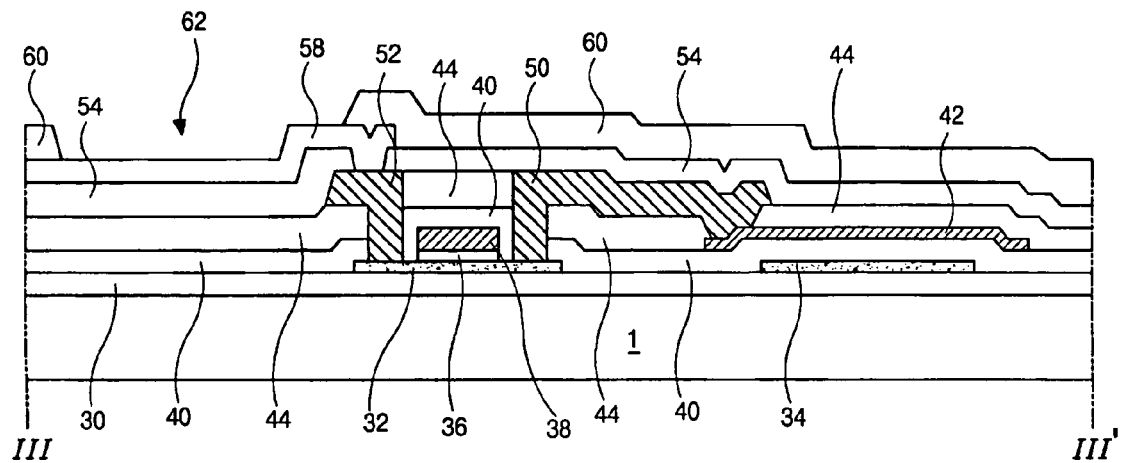
Figure 4I:
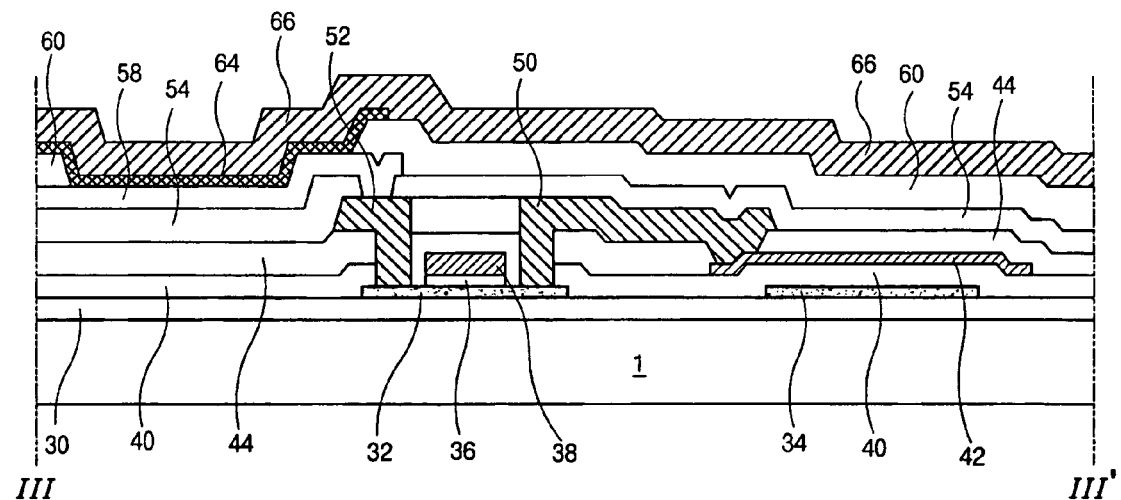
Figure 5:
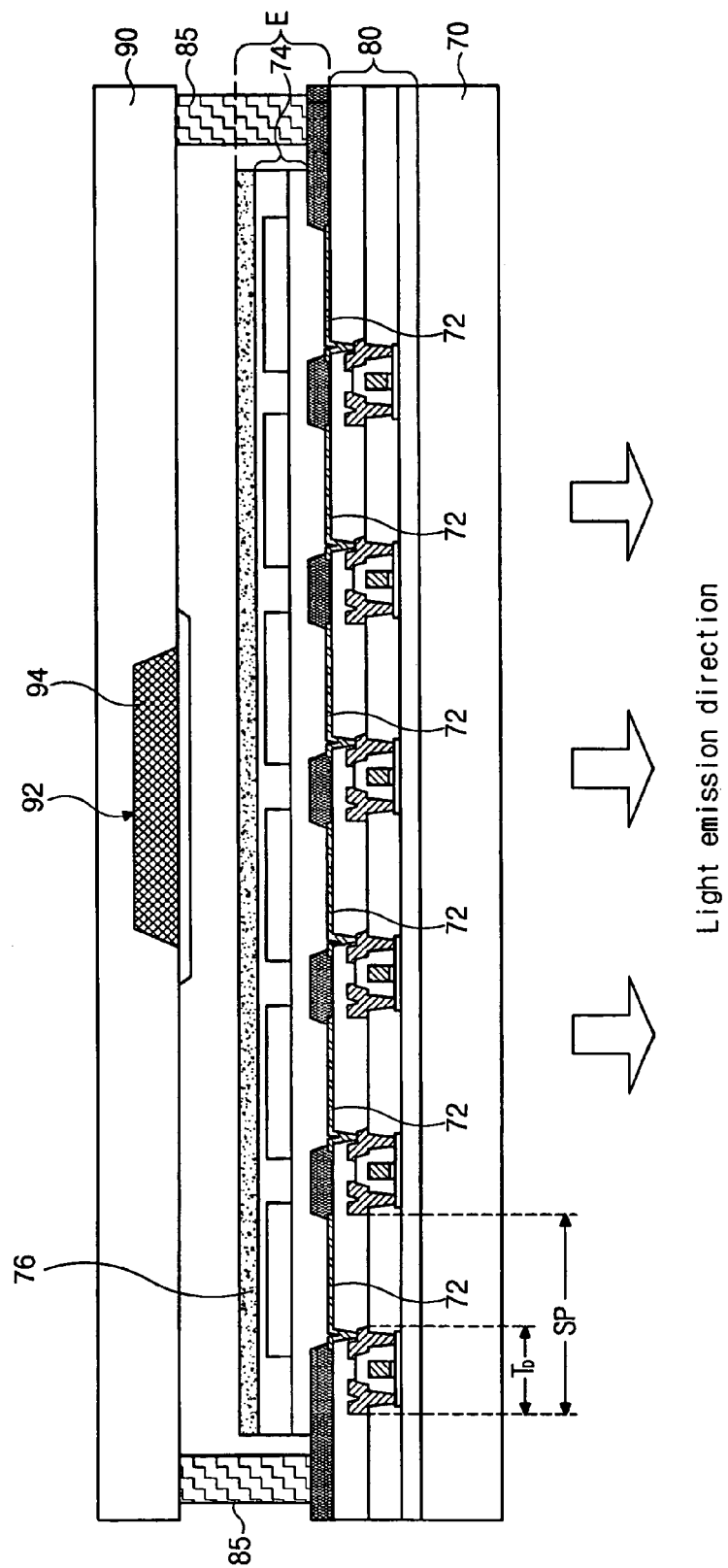
FIG. 5 is a cross-sectional view of a related art organic electroluminescent display (ELD) device.
Figure 6:
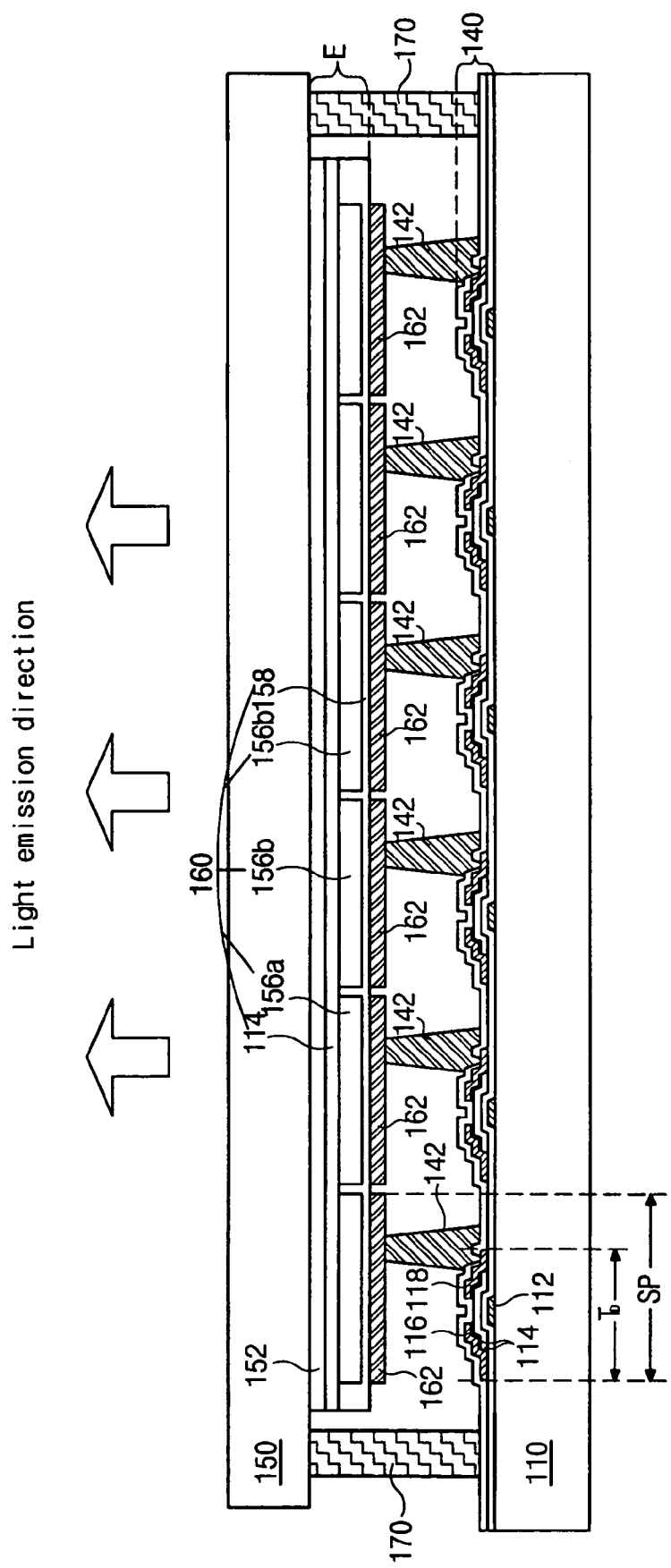
FIG. 6 is a cross-sectional view of a dual panel type organic electroluminescent display (ELD) device according to a first embodiment of the present invention.

FIG. 6 is a cross-sectional view of a dual panel type organic electroluminescent display (ELD) device according to a first embodiment of the present invention. In FIG. 6, a first substrate 110 and a second substrate 150 are spaced apart and oppose each other. A plurality of sub-pixels SP are defined on the first and second substrates 110 and 150. An array element layer 140 having a plurality of driving thin film transistors $T_D$ corresponding to each sub-pixel SP is formed on the first substrate 110. An electrical connecting pattern 142 connected to the driving thin film transistor $T_D$ is formed on the array element layer 140 in each sub-pixel SP. The electrical connecting pattern 142 is formed of conductive material and may be formed as a multi-layered structure including a core of insulating material within its width. The electrical connecting pattern 142 can be electrically connected to the driving thin film transistor $T_D$ via an additional connecting electrode (not shown). The driving thin film transistor TD has a gate electrode 112, a semiconductor layer 114 and source and drain electrodes 116 and 118, and the electrical connecting pattern 142 is connected to the drain electrode 118.

A first electrode 152 is formed on an inner surface of the second substrate 150 and an organic light-emitting layers 160 of a pixel having sub-light emitting layers 156a, 156b and 156c respectively for red (R), green (G) and blue (B) colors is formed beneath the first electrode 152. A plurality of second-electrodes 162 corresponding to each sub-pixel is formed beneath the organic light-emitting layer 160. More specifically, the organic light-emitting layers 160 of a pixel has a first carrier-delivering layer 154 between the first electrode 152 and the sub-light emitting layers 156a, 156b and 156c and a second carrier-delivering layer 158 between the sub-light emitting layers 156a, 156b and 156c and the second electrode 162. For example, if the first electrode 152 is an anode electrode and the second electrode 162 is a cathode electrode, the first carrier delivering layer 154 serves as a hole injection layer and then a hole transporting layer and the second carrier delivering layer 158 serves as an electron transporting layer and then an electron injection layer. The first and second electrodes 152 and 162 and the organic light-emitting layer 460 between the first and second electrodes 152 and 162 form an organic electroluminescent diode E.

In one aspect of the present invention, because the electrical connecting pattern 142 contacts the bottom surface of the second electrode 162, current supplied from the driving thin film transistor $T_D$ can be delivered to the second electrode 162 via the electrical connecting pattern 142. A seal pattern 170 is formed on one of the first and second substrates 110 and 150 to attach the first and second substrates 110 and 150. In the first embodiment of the present invention as shown in FIG. 6, the array element layer 140 and the organic electroluminescent diode E are formed on different substrates and are electrically connected to each other by the electrical connecting pattern 142. That is, the organic electroluminescent display (ELD) device of the present invention is a dual panel type organic electroluminescent display (ELD) device. As shown in FIG. 6, one pixel and sub-pixels of two other pixels are illustrated for explanation purposes. The structure of the driving thin film transistor $T_D$ and the connecting pattern of the electrical connecting pattern 142 can be modified to address many different conditions. In addition, because the organic electroluminescent display (ELD) device of the present invention is a top emission-type organic electroluminescent display (ELD) device, the design of the driving thin film transistor $T_D$ can be easily realized while achieving high aperture ratio and resolution can be obtained.

Figure 7:
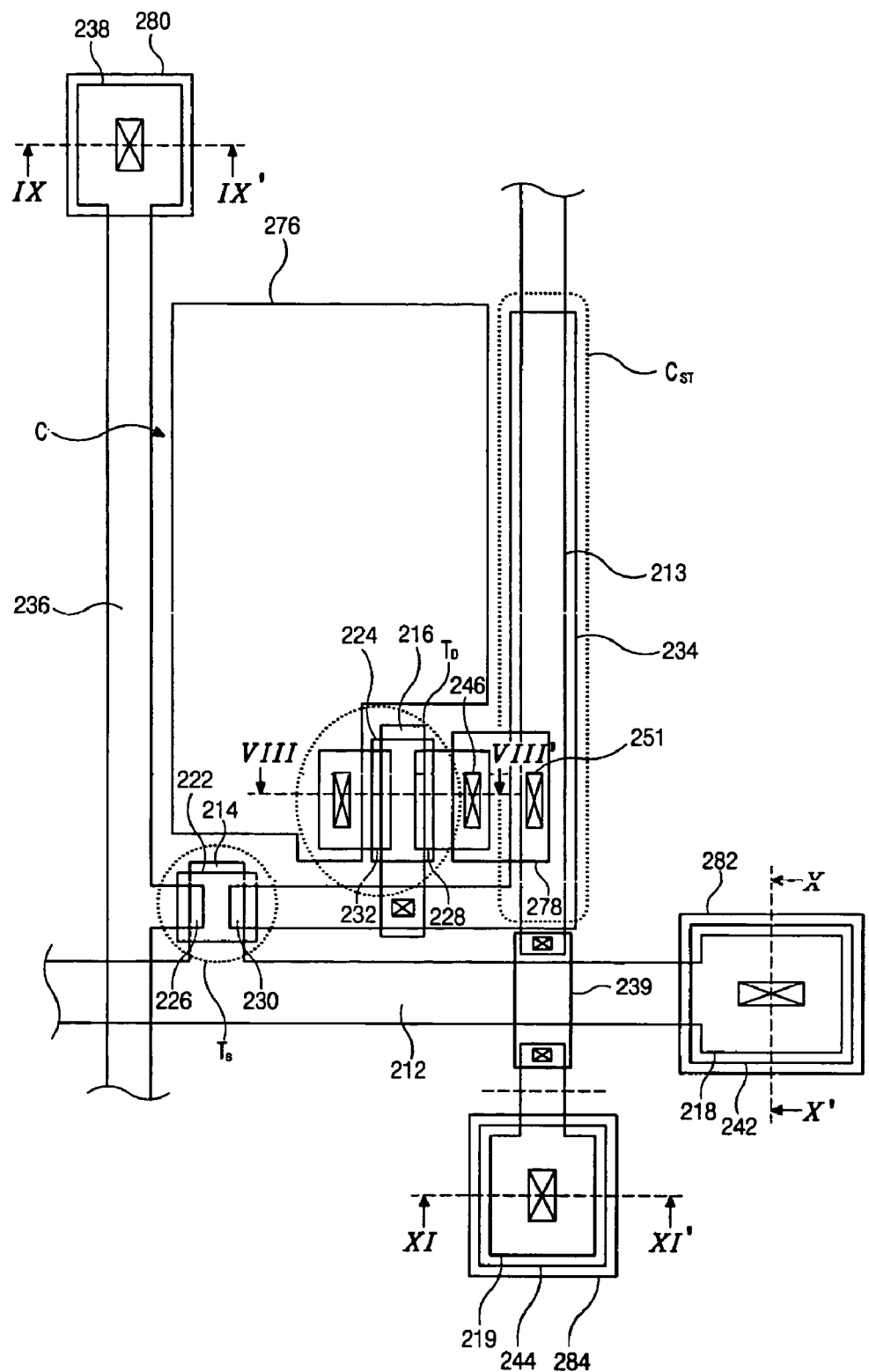
FIG. 7 is a plan view of a dual panel type organic electroluminescent display (ELD) device according to a second embodiment of the present invention.

FIG. 7 is a plan view of a dual panel type organic electroluminescent display (ELD) device according to a second embodiment of the present invention. In FIG. 7, a gate line 212 is formed in a first direction and data and power supply lines 236 and 213 spaced apart from each other are formed in a second direction perpendicular to the first direction. A switching thin film transistor $T_S$ is formed near an intersection of the gate and data lines 212 and 236. The switching thin film transistor $T_S$ has a gate electrode 214, a source electrode 226, a drain electrode 230 and a semiconductor layer 222. The gate electrode 214 extends from the gate line 212. The source electrode 226 extends from the data line 236. The drain electrode 230 is spaced apart from the source electrode 226. The semiconductor layer 222 covers portions of the gate electrode 214, the source electrode 226 and the drain electrode 230. The power supply line 213 is formed simultaneously with the gate line 212 with the same material as the gate line 212.

The driving thin film transistor $T_D$ in FIG. 7 is electrically connected to the switching thin film transistor $T_S$ and the power supply line 213. The driving thin film transistor $T_D$ has a driving gate electrode 216, a driving source electrode 228, a driving drain electrode 232 and a driving semiconductor layer 224. The driving gate electrode 216 is formed simultaneously with the gate line 212 with the same material as the gate line 212. The driving source and drain electrodes 228 and 232 are spaced apart from each other and are formed simultaneously with the data line 236 with the same material as the data line 236. The driving semiconductor layer 224 covers portions of the driving gate electrode 216, the driving source electrode 228 and the driving drain electrode 232.

A power electrode 278 in FIG. 7 is electrically connected to the driving source electrode 228 via a source contact hole 246 and to the power supply line 213 via a power supply contact hole 251. A connecting electrode 276 connected to the driving drain electrode 232 is formed in an electrical connecting region C and the connecting electrode 276 is formed simultaneously with the power electrode 278 with same material as the power electrode 278. The electrical connecting region C corresponds to a second electrode of a substrate (not shown) having an organic electroluminescent diode (not shown). Although not shown in FIG. 7, an electrical connecting pattern having a column shape is formed in the electrical connecting region C. More detail on the electrical connecting pattern (not shown) will be described later.

As also shown in FIG. 7, a capacitor electrode 234 overlapped with the power supply line 213 is formed under the power supply line 213. The capacitor electrode 234 and the power supply line 213 overlapped with the capacitor electrode 234 form a storage capacitor $C_{ST}$. Gate pad 218, data pad 238 and power supply pad 219 are respectively formed at ends of the gate line 212, the data line 236 and the power supply line 213. A first gate pad electrode 242 and a first power supply pad electrode 244 are respectively formed over the gate pad 218 and the power supply pad 219 simultaneously with the data line 236 with same material as the data line 236. A data pad electrode 280, a second gate pad electrode 282 and a second power supply pad electrode 284 are respectively positioned over the data pad 238, the first gate pad electrode 242 and the first power supply pad electrode 244 simultaneously with the connecting electrode 276 having the same material as the connecting electrode 276. Because the gate line 212 and the power supply line 213 are formed in a same process with the same material, the gate and power supply lines 212 and 213 may short adjacent to an intersection of the gate and the power supply lines 212 and 213. Accordingly, a separate power supply link line 239 formed simultaneously with the data line 236 with the same material as the data line 236 is formed connected to a separate power supply line 213 near the intersection of the gate line 212 and the power supply line 213 such that the aforementioned short between the gate line 212 and the power supply line 213 can be prevented. The power supply line 213 is connected to the power supply link line 239 via additional contact holes. Because different signals are separately applied to the data pad 238 and the power supply pad 219, the data pad 238 is desirably disposed on the opposite side of the power supply pad 219.

FIGS. 8A to 8G are cross-sectional views taken along a line VIII–VIII' in FIG. 7 and illustrate a fabrication sequence of a laminated structure for a driving thin film transistor region. FIGS. 9A to 9G are cross-sectional views taken along a line IX–IX' in FIG. 7 and illustrate a fabrication sequence of a laminated structure for a data pad region. FIGS. 10A to 10G are cross-sectional views taken along a line X–X' in FIG. 7 and illustrate a fabrication sequence of a laminated structure for a gate pad region. FIGS. 11A to 11G are cross-sectional views taken along a line XI–XI' in FIG. 7 and illustrate a fabrication sequence of a laminated structure for a power supply pad region. The driving gate electrode, the driving semiconductor—layer, the driving source electrode and the driving drain electrode will be respectively be called a gate electrode, a semiconductor layer, a source electrode and a drain electrode for explanation purposes.

In reference to FIGS. 8A, 9A, 10A and 11A, a gate electrode 216, a gate pad 218 and a power supply pad 219 are formed on a substrate 210 of a first metal material by a first mask process. Although not shown in FIGS. 8A, 9A, 10A and 11A, a power supply line is also formed connected to the power supply pad. The first metal material is selected from metal materials having a low specific resistance and preferably selected from metal materials including aluminum (Al).

Although not shown in FIGS. 8A, 9A, 10A or 11A, a mask process for patterning laminated structures of the present invention is performed as follows. A photoresist is coated on the substrate or a certain layer and then a mask having a desired pattern is disposed over the photoresist. The coated photoresist layer is exposed to light and then developed to form a photoresist pattern. Portions of the layer exposed by the photoresist pattern are etched away to obtain a desired pattern.

Referring to FIGS. 8B, 9B, 10B and 11B, a gate insulating layer 220 is formed by depositing a first insulating material over the whole substrate 210 on which the gate electrode 216, the gate pad 218 and the power supply pad 219 are already formed. A semiconductor layer 224 is subsequently formed on the gate insulating layer 220 in the space corresponding to the gate electrode 216 by sequentially depositing amorphous silicon (a-Si:H) and impurity-doped amorphous silicon (n$^+$a-Si:H) on the gate insulating layer 220 in the space corresponding to the gate electrode 216 and then patterning it by a second mask process. The semiconductor layer 224 includes an active layer 224a formed of amorphous silicon (a-Si:H) and an ohmic contact layer 224b formed of impurity-doped amorphous silicon (n$^+$a-Si:H). The first insulating material for the gate insulating layer 216 can be formed of insulating material including silicon and preferably can be formed of silicon nitride (SiNx), for example.

Figure 10A:
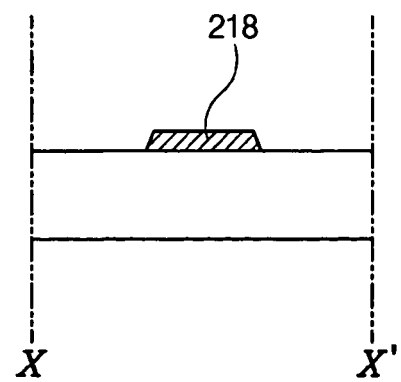
FIGS. 10A to 10G are cross-sectional views taken along a line X–X' in FIG. 7 and illustrate a fabrication sequence of a laminated structure for a gate pad region.
Figure 10B:
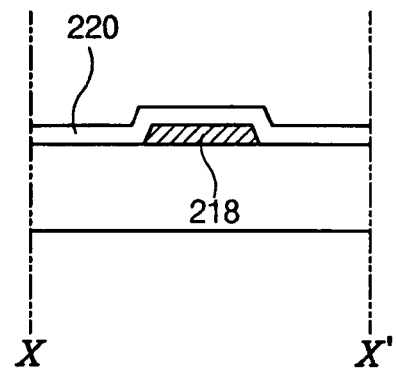
Figure 10C:
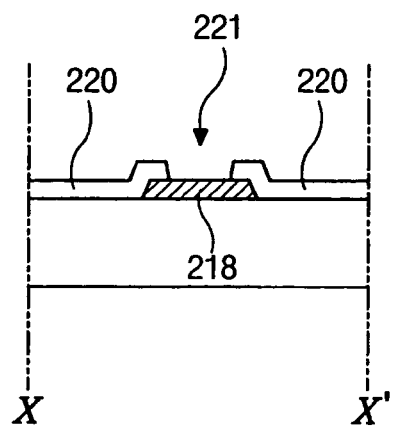
Figure 10D:
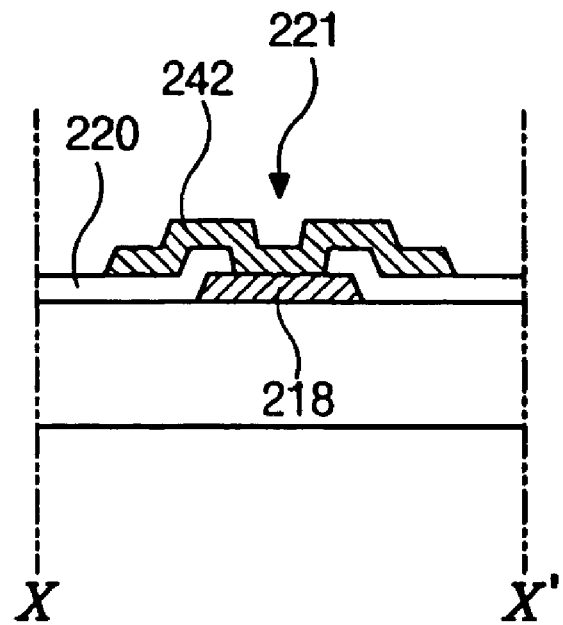
Figure 10E:
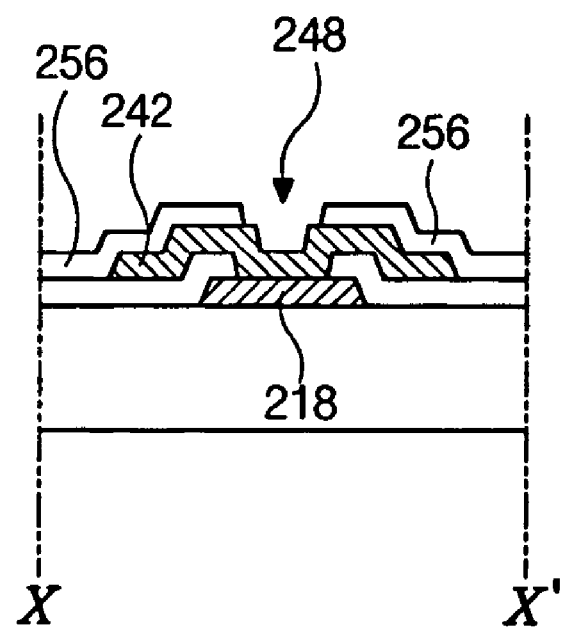
Figure 10F:
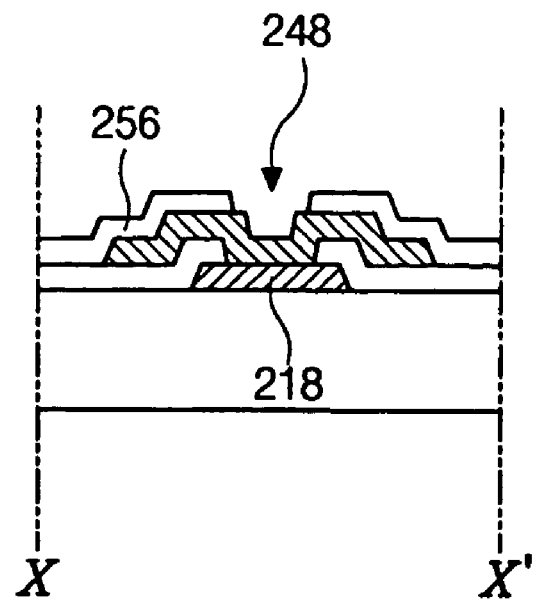
Figure 10G:
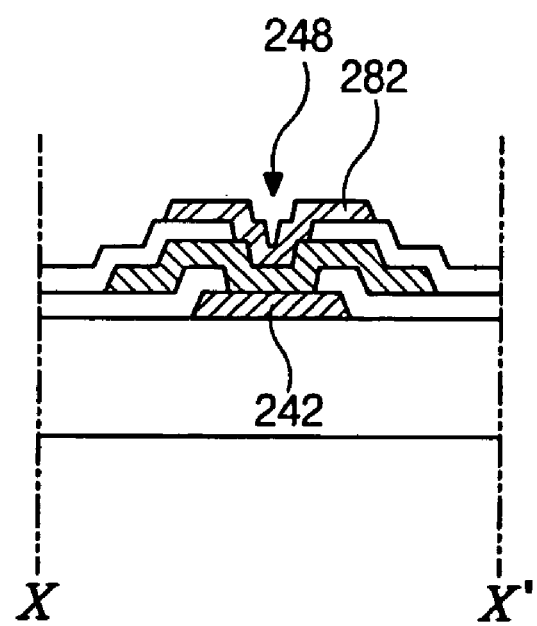
Figure 11A:
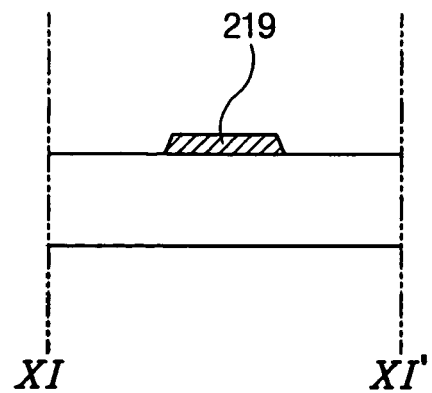
FIGS. 11A to 11G are cross-sectional views taken along a line XI–XI' in FIG. 7 and illustrate a fabrication sequence of a laminated structure for a power supply pad region.
Figure 11B:
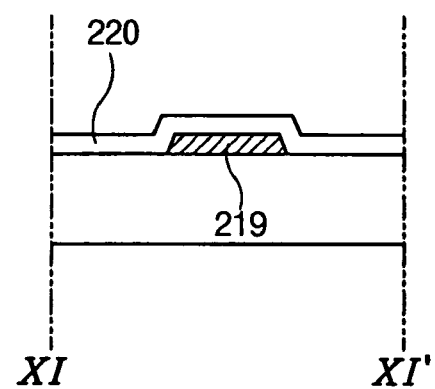
Figure 11C:
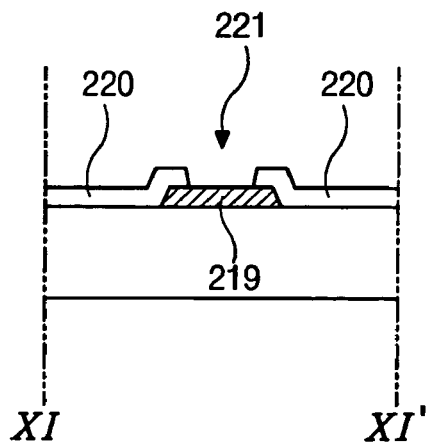
Figure 11D:
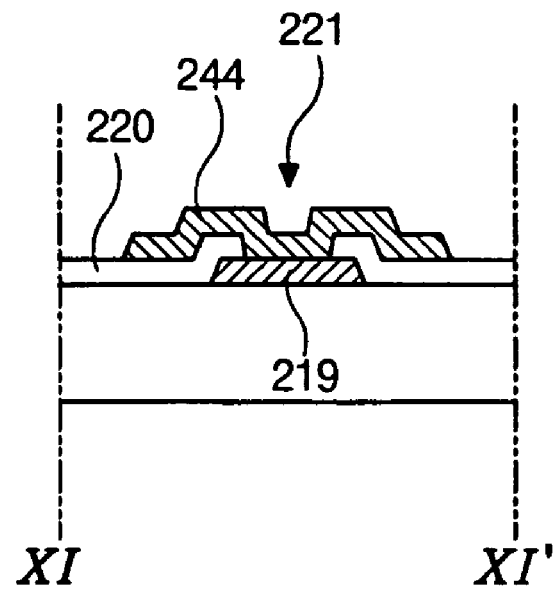
Figure 11E:
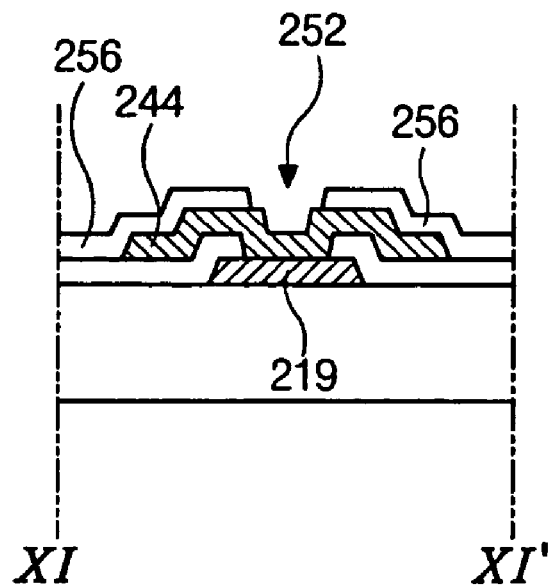
Figure 11F:
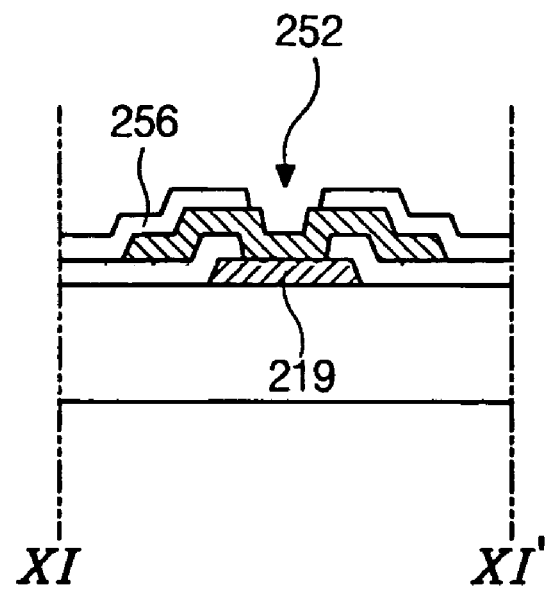
Figure 11G:
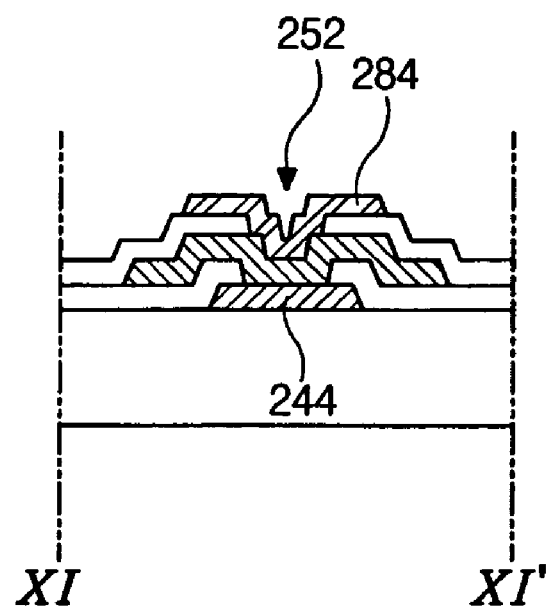

Referring to FIGS. 10C and 11C, a first gate pad contact hole 221 exposing a portion of the gate pad 218 and a first power supply pad contact hole 223 exposing a portion of the power supply pad 219 are formed by a third mask process. Then, referring to FIGS. 8D, 9D, 10D and 11D, a source electrode 228, a drain electrode 232 spaced apart from the source electrode 228, a first gate pad electrode 242 and a first power supply pad electrode 244 are formed by depositing second metal material over the whole substrate 210 on which the semiconductor layer 224, the first gate pad contact hole 221 and the first power supply pad contact hole 223 are already formed and then patterning it by a fourth mask process. The source electrode 228 and the drain electrode 232 spaced apart from the source electrode 228 are formed on the semiconductor layer 224. The data pad 238 is formed in a data pad forming region DP in FIG. 9D. The first gate pad electrode 242 and the first power supply pad electrode 244 are respectively connected to the gate pad 218 and the power supply pad 219 via the first gate pad contact hole 221 and the first power supply pad contact hole 223.

Although not shown in FIGS. 8D, 9D, 10D and 11D, a data line (not shown) is formed in a second direction and the data pad forming region DP is formed at one end of the data line. The data pad forming region DP is preferably formed on an opposite side of the power supply pad 219. The second metal material is selected from metal materials having a strong chemical corrosion-resistance and is preferably selected from molybdenum (Mo), titanium (Ti), chromium (Cr) and tungsten (W). In this step, a portion of the ohmic contact layer 224b between the source and drain electrodes 228 and 232 is removed to expose a portion of the active layer 224a and the exposed active layer 224a form a channel ch. The gate electrode 216, the semiconductor layer 224, the source electrode 228 and the drain electrode 232 form a driving thin film transistor $T_D$.

Referring to FIGS. 8E, 9E, 10E and 11E, a passivation layer 256 having a source contact hole 246, a drain contact hole 247, a data pad contact hole 250, a second gate pad contact hole 248 and a second power supply pad contact hole 252 is formed by depositing a second insulating material on the whole substrate 210 on which the driving thin film transistor $T_D$, the data pad 238, the first gate pad electrode 242 and the first power supply pad electrode 244 are already formed and then patterning the deposited second insulating material by a fifth mask process. The source contact hole 246 exposes a portion of the source electrode 228 and a drain contact hole 247 exposes a portion of the drain electrode 232. The data pad contact hole 250 exposes a portion of the data pad 238. The second gate pad contact hole 248 and the second power supply pad contact hole 252 expose portions of the first gate pad electrode 242 and the first power supply pad electrode 244, respectively. The second insulating material may be selected from organic insulating materials or inorganic insulating materials. In addition, the second insulating material maybe formed in a single layer or multiple layers. However, it is desirable to use inorganic insulating material for the passivation layer 256 contacting the driving thin film transistor $T_D$.

Figure 8A:
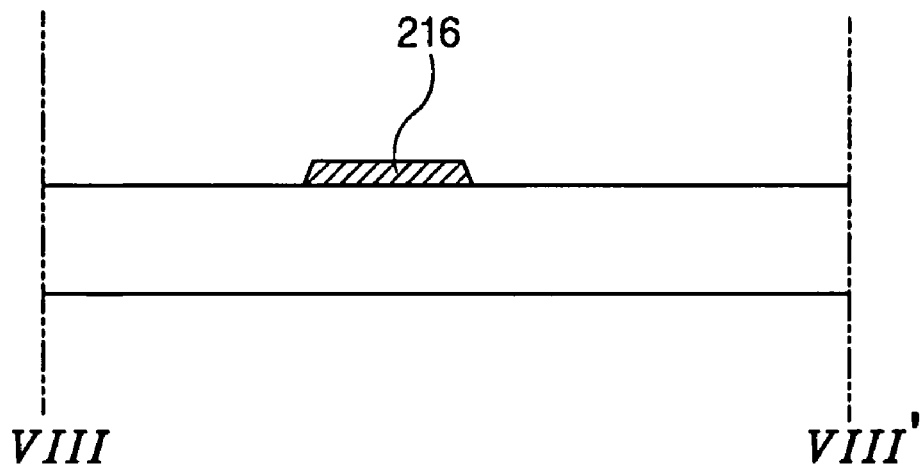
FIGS. 8A to 8G are cross-sectional views taken along a line VIII–VIII' in FIG. 7 and illustrate a fabrication sequence of a laminated structure for a driving thin film transistor region.
Figure 8B:
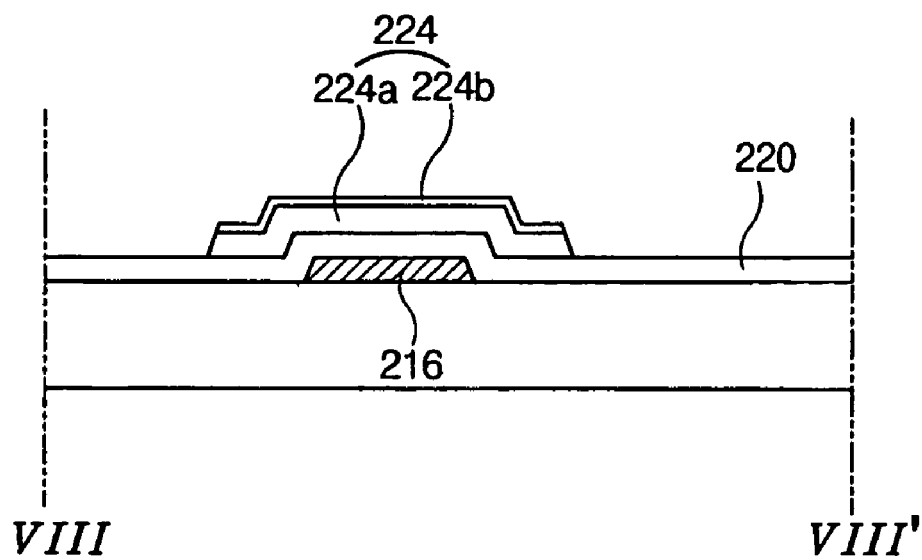
Figure 8C:
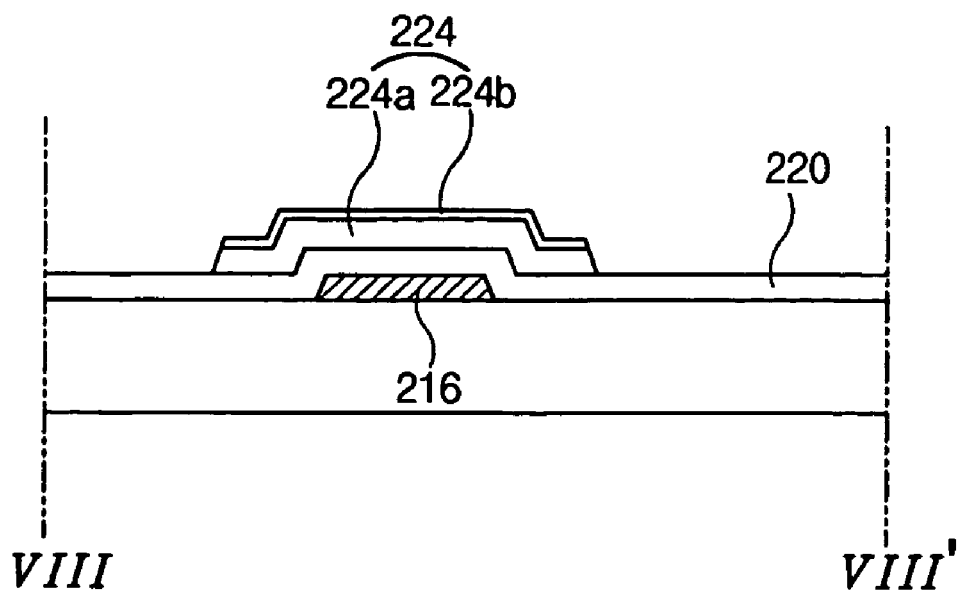
Figure 8D:
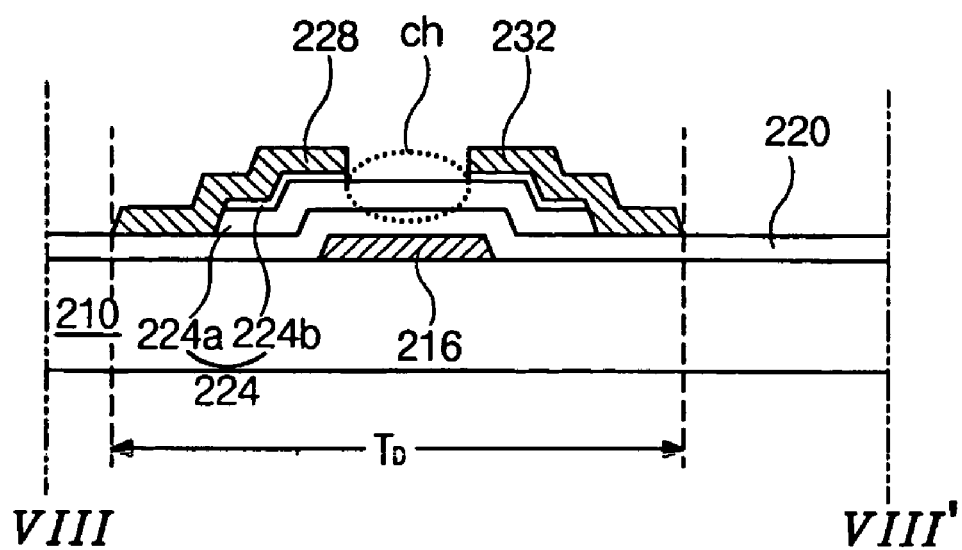
Figure 8E:
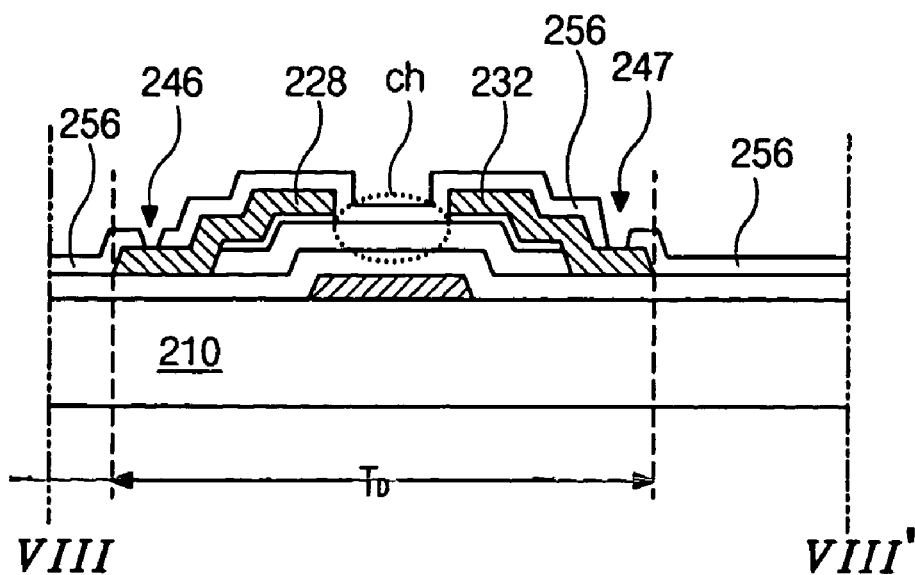
Figure 8F:
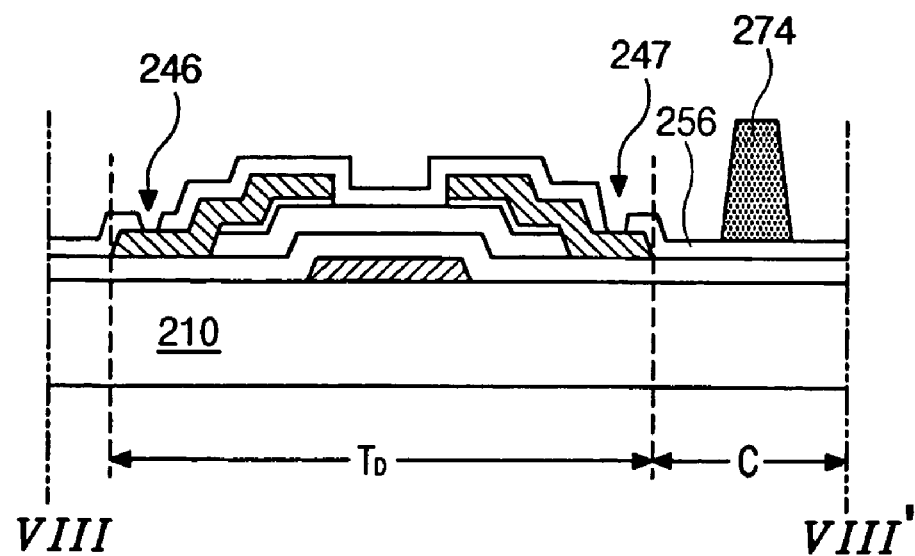
Figure 8G:
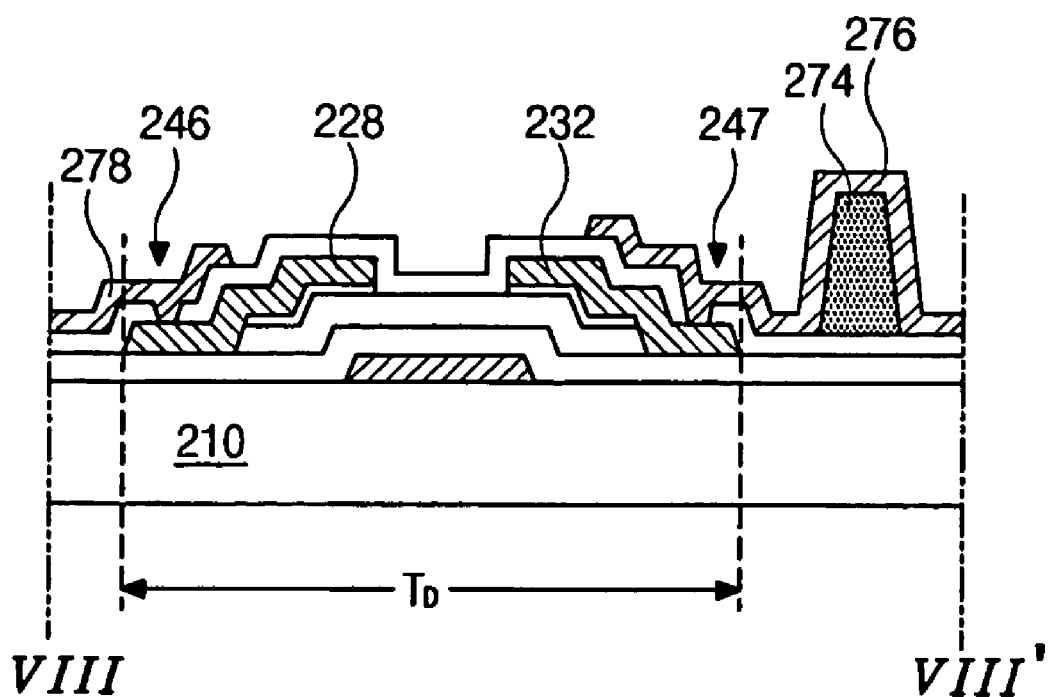
Figure 9A:
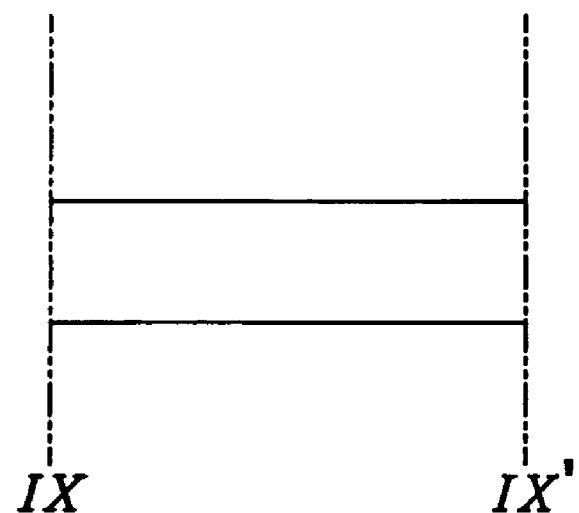
FIGS. 9A to 9G are cross-sectional views taken along a line IX–IX' in FIG. 7 and illustrate a fabrication sequence of a laminated structure for a data pad region.
Figure 9B:
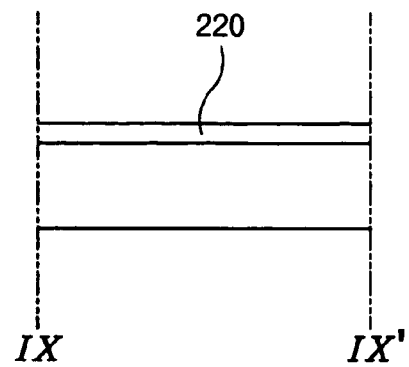
Figure 9C:
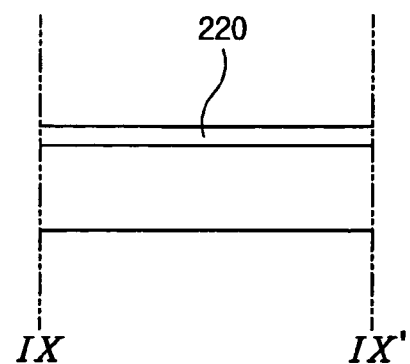
Figure 9D:
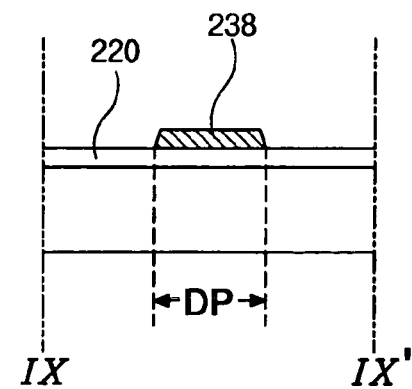
Figure 9E:
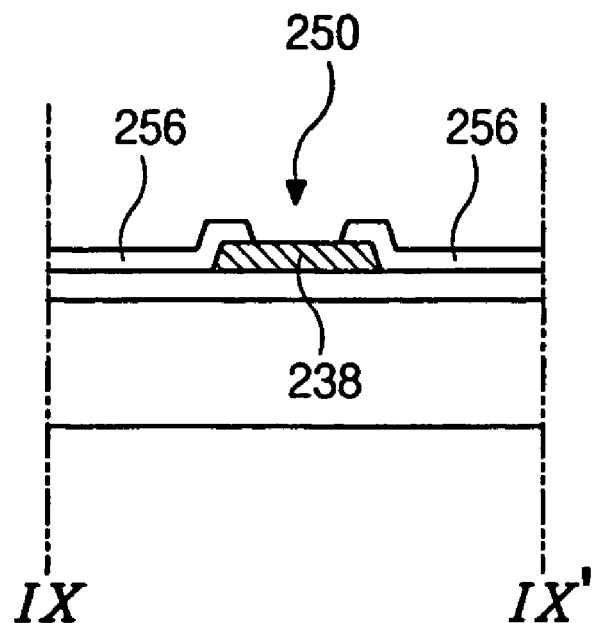
Figure 9F:
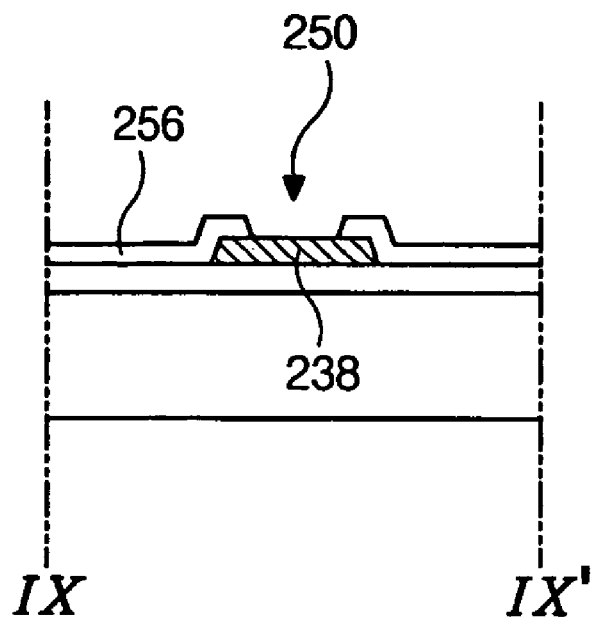
Figure 9G:
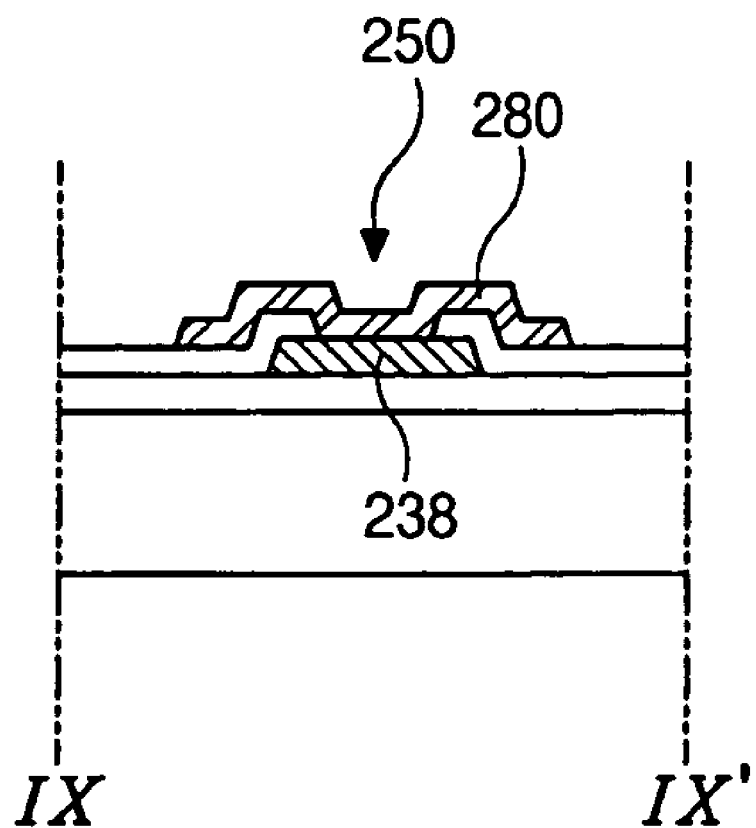

Referring to FIGS. 8F, an electrical connecting pattern 274 having a column shape is formed by depositing a third insulating material on the passivation layer 256 in space corresponding to an electrical connecting region C and then patterning the deposited third insulating material by a sixth mask process. It preferable that the electrical connecting region C corresponds to a second electrode (not shown) of an organic electroluminescent diode (not shown). The third insulating material is desirably selected from organic insulating material so that the electrical connecting pattern 274 has a certain thickness.

Referring to FIGS. 8G, 9G, 10G and 11G, a connecting electrode 276, a power electrode 278, a data pad electrode. 280, a second gate pad electrode 282 and a second power supply pad electrode 284 are formed by depositing a third metal material on the whole substrate 210 on which the electrical connecting pattern 274 is already formed and then patterning the deposited third metal material by a seventh mask process. The connecting electrode 276 is formed on the electrical connecting pattern 274 and connected to the drain electrode 232 via the drain contact hole 247. The power electrode 278 is connected to the source electrode 228 via the source contact hole 246 and the data pad electrode 280 is connected to the data pad 238 via the data pad contact hole 250. The second gate pad electrode 282 is connected to the first gate pad electrode 242 via the second gate pad contact hole 248 and the second power supply pad electrode 284 is connected to the first supply pad electrode 244 via the second supply pad contact hole 252. Although not shown in FIGS. 8G, 9G, 10G and 11G, the power electrode 278 is connected to the power supply line 213 shown in FIG. 7 via an additional contact hole 251 shown in FIG. 7.

The dual panel type organic electroluminescent display (ELD) device according to the present invention has the following advantages. First, because the array element layer having a thin film transistor and the organic electroluminescent diode are respectively formed on different substrates, a production yield and a production management efficiency can be improved and a life cycle of products can be extended. Second, because the organic electroluminescent display (ELD) device according to the present invention is a top emission-type, a design of the thin film transistor can be done easily and high aperture ratio and resolution can be acquired. Third, because an inverse staggered type thin film transistor using amorphous silicon is adopted for the organic electroluminescent display (ELD) device, the thin film transistor can be formed under a lower temperature condition and because gate patterns and power supply patterns are formed in a same mask process, a total number of required masks is reduced and thus a thin film transistor forming process can be simplified.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device having a first substrate having an array element layer and a second substrate having an organic electroluminescent diode, comprising:
    a gate line formed on the first substrate in a first direction;
    a data line formed on the first substrate in a second direction perpendicular to the first direction;
    a power supply line spaced apart from the data line and formed on the first substrate in the second direction, the power supply line being formed with same material as the gate line in a same process as the gate line, the power supply line having an additional power supply link line near a crossing portion of the gate line and the power supply line;
    a switching thin film transistor formed near a crossing portion of the gate and data lines, the switching thin film transistor having a semiconductor layer formed of amorphous silicon;
    a driving thin film transistor formed near a crossing portion of the switching thin film transistor and the power supply line, the driving thin film transistor having a semiconductor layer formed of same material as the semiconductor layer of the switching thin film transistor;
    a connecting electrode connected to the driving thin film transistor; and
    an electrical connecting pattern formed between the first substrate and the second substrate for electrically connecting the connecting electrode to the organic electroluminescent diode.

2. The device according to claim 1, further comprising a gate pad, a data pad and a power supply pad disposed at one ends of the gate line, the data line and the power supply line, respectively.

3. The device according to claim 2, further comprising a first gate pad electrode on the gate pad and first power supply pad electrode on the power supply pad, wherein the first gate pad electrode and the first power supply pad electrode are formed with same material as the data line in a same process as the data line.

4. The device according to claim 3, further comprising a data pad electrode on the data pad, a second gate pad electrode on the first gate pad electrode and a second power supply pad electrode on the first power supply pad electrode, wherein the data pad electrode, the second gate pad electrode and the second power supply pad electrode are formed with same material as the connecting electrode in a same process as the connecting electrode.

5. The device according to claim 1, wherein the switching thin film transistor has a gate electrode, a semiconductor layer, a source electrode and a drain electrode, the gate electrode being extended from the gate line, the semiconductor layer being formed over the gate electrode and having an active layer formed of amorphous silicon and an ohmic contact layer formed of impurity-doped amorphous silicon, the source and drain electrodes being formed on the semiconductor layer and spaced apart from each other, and wherein the driving thin film transistor has a driving gate electrode, a driving semiconductor layer, a driving source electrode and a driving drain electrode, the driving gate electrode being connected to the drain electrode, the driving semiconductor layer being formed over the driving gate electrode, the driving source and drain electrodes being formed on the driving semiconductor layer and spaced apart from each other.

6. The device according to claim 5, further comprising a power electrode between the driving source electrode and the power supply line, wherein the power electrode is formed with same material as the connecting electrode in a same process as the connecting electrode and connected to the driving source electrode and the power supply line.

7. The device according to claim 1, wherein the power supply link line is formed with the same material as the data line in a same process as the data line.

* * * * *